Nov. 16, 1965 H. ROSENBERG 3,218,471

CRYOTRON COUNTER CIRCUIT WITH AUTOMATIC RESET

Filed May 15, 1962 2 Sheets-Sheet 1

INVENTOR.
HARVEY ROSENBERG
BY Charles R. Lepchinsky
ATTORNEY

CRYOTRON COUNTER CIRCUIT WITH AUTOMATIC RESET

Filed May 15, 1962 2 Sheets-Sheet 2

INVENTOR.
HARVEY ROSENBERG
BY Charles R. Lepchinsky
ATTORNEY

United States Patent Office 3,218,471

Patented Nov. 16, 1965

3,218,471

CRYOTRON COUNTER CIRCUIT WITH AUTOMATIC RESET

Harvey Rosenberg, Drexel Hill, Pa., assignor to Burroughs Corporation, Detroit, Mich., a corporation of Michigan Filed May 15, 1962, Ser. No. 194,907
11 Claims. (Cl. 307—88.5)

This invention relates to counter circuits and more particularly to counter circuits which utilize superconducting components such as cryotrons.

The cryotron, a relatively new development in the electronics art, utilizes the superconductive characteristics displayed by certain materials when held under conditions of very low temperature. In the absence of a magnetic field, certain materials will change from a resistive state to a superconducting state, in which their electrical resistance is zero, as their temperature is reduced below a certain critical temperature. A magnetic field applied to such materials will lower the temperature at which the transition from a resistive state to a superconducting state occurs. Accordingly, if a superconducting material is held at a constant temperature, a magnetic field of sufficient density will cause the superconducting material to enter the resistive or normal state.

A thin film cryotron is a four terminal device which utilizes these properties of superconducting materials and comprises, essentially, a gate portion having a first and second terminal and a control portion which creates a magnetic field that controls the resistivity of the gate portion and which also has a first and second terminal. Even though cryotron circuits must be refrigerated to very low temperatures, they have many advantages such as low power consumption, little or no noise, high operating speeds, economical fabrication, occupy little space and are light weight etc., so that it can reasonably be expected that they will gain wide acceptance in the electronics art.

Accordingly, an object of this invention is to provide a cryotron circuit.

Another object of this invention is to provide a cryotron counter circuit.

A further object of this invention is to provide a new and improved counter circuit that utilizes superconducting cryotron components.

Still another object of this invention is to improve counter circuits.

These and other objects are accomplished by the present invention by utilizing a first superconducting loop circuit, which provides first and second current paths, connected to a first current source. Cryotron means are associated with said first path of the first loop circuit to receive pulses from a source of periodic occurring pulses for diverting an increment of the current in said first path into said second path of the loop circuit each time a pulse occurs. A second superconducting loop circuit, also providing first and second current paths, is connected to a second current source. The second loop circuit is coupled to the first loop circuit in such a manner as to be responsive to a predetermined value of diverted current in said second path of the first loop, which is proportional to a predetermined number of pulses applied to said cryotron means, for switching the diverted current in said second path back to said first path of the first loop prior to the occurrence of a next pulse from the source of pulses. This is accomplished, in part, by using pulses having a time duration less than the time constant of said first path of the first loop. The time constant of this current path is designed to be greater than the time constant of the remaining three current paths.

The exact nature of this invention as well as other objects and advantages thereof will be readily apparent from consideration of the following specification relating to the annexed drawings in which.

Figure 1:
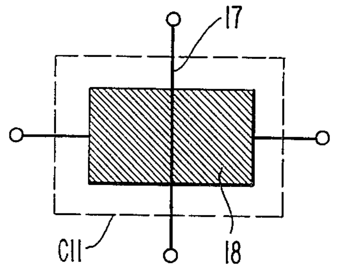
FIGURE 1 is a schematic representation of a thin film cryotron.

Referring now to FIGURE 1 there is shown, within the dotted outline, a symbolic or schematic diagram of a thin film cryotron $C_{11}$ comprising a gate element 18 and a control element 17. The operation of the cryotron is such that the superconducting gate element 18 can be made resistive by means of a magnetic field generated by passing a current through the control element 17. This results from known physical phenomenon whereby any superconductor can be switched into the resistive or normal state when subjected to a magnetic field greater than a so-called "critical" value.

Figure 2:
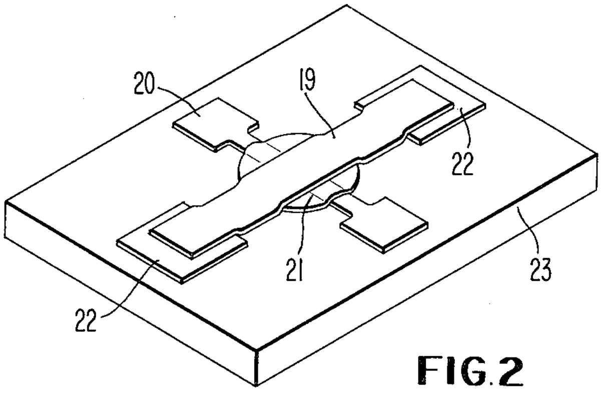
FIGURE 2 is an isometric view illustrating the physical structure of a typical thin film cryotron.

The basic physical structure of a typical thin film cryotron is shown in FIGURE 2 wherein there is shown an evaporated gate element 19, made of a suitable material such as tin. At right angles to the gate element 19 is a much narrower evaporated control element 20, made of a suitable material such as lead. The gate and control elements are insulated from each other by an evaporated film of insulating material 21 which may be silicon monoxide. Connectors 22, made of a suitable material such as lead, are connected to each end of the gate element 19 to permit easy electrical connection to the gate element. The complete cryotron is deposited on the flat surface of an insulator such as a glass substrate 23. A more detailed decription of the physical and electrical properties of thin film cryotrons appears on pages 1395 to 1404 of the August 1960 issue of the Proceedings of the IRE in an article by V. L. Newhouse et al. entitled, "An Improved Film Cryotron and Its Application to Digital Computers."

Figure 3:
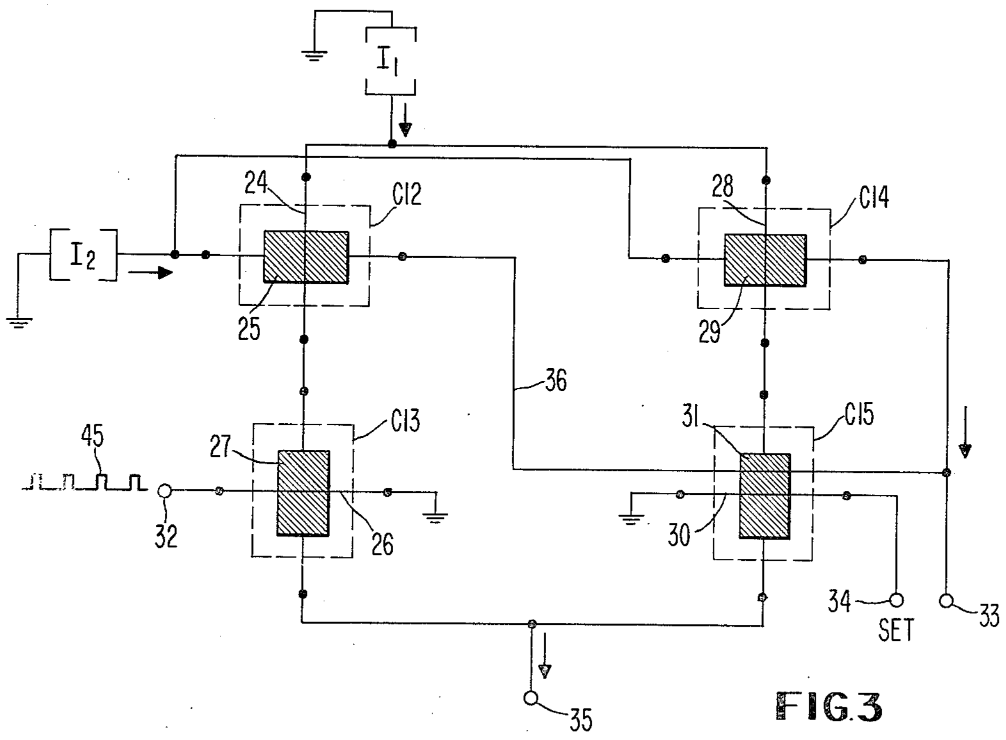
FIGURE 3 is a view of a preferred embodiment of the present invention.

Referring now to FIGURE 3, which is a preferred embodiment of the present invention, there is shown a superconducting circuit including a first source of current $I_1$, a second source of current $I_2$, and a first, second, third and fourth cryotron having the reference characters $C_{13}$, $C_{14}$, $C_{15}$ and $C_{12}$ respectively. The first current source $I_1$ is coupled to a terminal 35 by way of a first superconducting loop circuit having a first current path, comprising the control 24 of the cryotron $C_{12}$ serially connected to the gate 27 of the cryotron $C_{13}$, in parallel with a second current path, comprising the control 28 of the cryotron $C_{14}$ serially connected to the gate 31 of the cryotron $C_{15}$.

The second current source $I_2$ is coupled to a terminal 33 by way of a second superconducting loop circuit having a first current path, comprising the gate 29 of the cryotron $C_{14}$, in parallel with a second current path, comprising the gate 25 of the cryotron $C_{12}$ serially connected to a superconducting lead 36 which passes over the gate 31 of the cryotron $C_{15}$. The superconducting lead 36 functions as a second control for the cryotron $C_{15}$, i.e., a current in the lead 36, that creates a sufficient magnetic field, will cause the gate 31 to switch from the superconducting state to the resistive or normal state. It should be noted that all of the lines shown in FIGURE 3 interconnecting the four cryotrons $C_{12}$, $C_{13}$, $C_{14}$ and $C_{15}$ are superconducting conductors.

One end of the control 30 of the cryotron $C_{15}$ is coupled to the terminal 34 to which a set pulse (not shown) is applied and one end of the control 26 of the cryotron $C_{13}$ is coupled to the terminal 32 to which a source of periodic occurring pulses 45, that are to be counted, are applied. The second superconducting loop circuit is coupled to the first superconducting loop circuit by the cryotrons $C_{12}$, $C_{14}$ and $C_{15}$ which are common to both the first and second loop circuits.

Figure 4:
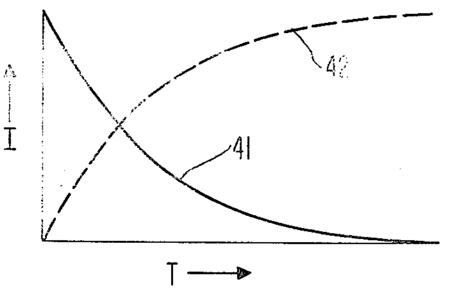
FIGURE 4 shows the exponential increase and decrease of current between two superconducting paths.

When current in the first current path is switched, in a manner described herein below, into the second current path, or vice versa, in either or both of the loop circuits described above, a finite time is required which is determined by the time constant of the loop circuit. This is shown in the graph comprising FIGURE 4 wherein the vertical coordinate represents increasing current and the horizontal coordinate represents progressively increasing units of time. The solid curve 41 indicates exponentially decreasing current in the current path from which current is being switched and the dotted curve 42 indicates exponentially increasing current in the current path which is receiving the switched current. The time constant of any current path is defined as the sum of the inductance of the current path from which current is being switched and the inductance of the current path which is to receive the switched current divided by the resistance of the current path from which the current is being switched. In as much as the resistance of a cryotron is directly proportional to the effective bulk resistivity of the materials used and the width of the control element and inversely proportional to the width and thickness of the gate element, it is clear that the resistance, and therefore the time constants, of the four current paths described above in connection with the two circuit loops can have a predetermined relationship by properly choosing the materials and the relative geometries of the cryotrons $C_{12}$, $C_{13}$, $C_{14}$ and $C_{15}$. Also, since the inductance of a current path is directly proportional to the length of the superconductors and inversely proportional to the width of the superconductors, the inductances can also be varied to obtain various time constant relationships.

In the embodiment of the present invention shown in FIGURE 3, the time constant of the first current path of the first loop circuit, which comprises the control 24 of the cryotron $C_{12}$ in series with the gate 27 of the cryotron $C_{13}$, is at least several times larger than the second current path time constant of the first loop circuit, which comprises the gate 31 of the cryotron $C_{15}$ in series with the control 28 of the cryotron $C_{14}$, and is also several times larger than the time constants of the first and second current paths in the second loop circuit. The time duration of each of the series of periodic occurring pulses 45 applied to the terminal 32 is less than the time constant of the first current path of the first loop circuit, which comprises the control 24 of the cryotron $C_{12}$ in series with the gate 27 of the cryotron $C_{13}$, for reasons which will become apparent after a reading of the detailed description herein below relating to the operation of the circuit shown in FIGURE 3.

The operation of the circuit shown in FIGURE 3 is such that initially a current set pulse (not shown) is applied to the control 30 of the cryotron $C_{15}$ by way of the terminal 34. The current due to the set pulse in the control 30 creates a magnetic field of sufficient magnitude to cause the gate 31 of the cryotron $C_{15}$ to be switched from a superconducting state into the resistive or normal state. Before the termination of the set pulse, the first current source $I_1$ is turned on and all of the current it supplies will flow through the superconductive first current path, which comprises the gate 27 of the cryotron $C_{13}$ in series with the control 24 of the cryotron $C_{12}$, of the first loop circuit. No $I_1$ current flows through the second current path, comprising the control 28 of the cryotron $C_{14}$ in series with the gate 31 of the cryotron $C_{15}$, of the first loop circuit because the cryotron $C_{15}$ is in the resistive state causing the second current path to offer a resistance to any $I_1$ current. Once the $I_1$ current is established in the first current path of the first loop circuit, the set pulse (not shown) can be terminated and the $I_1$ current will continue to flow through the first current path.

The $I_1$ current flowing through the control 24 of the cryotron $C_{12}$ is sufficient to cause the gate 25 of the cryotron $C_{12}$ to be switched into the resistive or normal state. Since the now resistive gate 25 of the cryotron $C_{12}$ is in the second current path of the second loop circuit, when the current $I_2$ is turned on it will all flow through the superconducting first current path, comprising the gate 29 of the cryotron $C_{14}$, of the second loop circuit. The circuit is now ready to begin counting the periodic occurring pulses 45 which are applied to the control 26 of the cryotron $C_{13}$ which has its gate 27 in the first current path of the first loop circuit.

Figure 5:
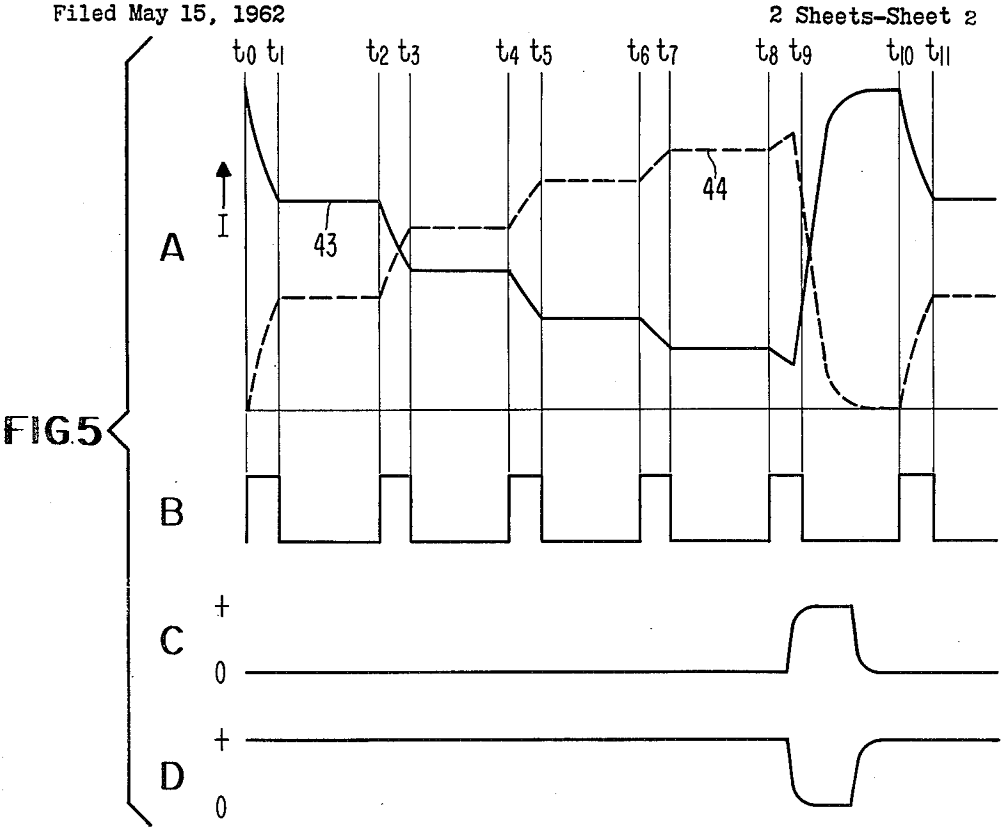
FIGURE 5 is a series of curves illustrating idealized wave-shapes that occur at various points in the circuit shown in FIGURE 3.

Referring now to FIGURE 5, illustrating idealized waveforms at various points in the circuit of FIGURE 3, there is shown in FIGURE 5A a solid curve 43 which represents current in the first current path of the first loop circuit and a dotted curve 44 which represents current in the second current path of the first loop circuit. FIGURE 5B show the periodic pulses to be counted. FIGURE 5C shows the current in the second current path of the second loop circuit, and FIGURE 5D shows the current in the first current path of the second loop circuit. Notice, that before the first pulse to be counted arrives, all the $I_1$ current flows through the first current path of the first loop circuit and all of the $I_2$ current flows through the first current path of the second loop circuit.

Referring now to FIGURES 3 and 5, at time $t_o$ the first of a plurality of pulses, shown in FIGURE 5B, arrives at terminal 32 and creates a current in the control 26 of the cryotron $C_{13}$ of sufficient magnitude to cause the gate 27 to become resistive. When the gate 27 of the cryotron $C_{13}$ becomes resistive, the current $I_1$ flowing in the first current path of the first loop circuit, of which the gate 27 of the cryotron $C_{13}$ is a part, begins to decrease exponentially as it is diverted into the superconducting second current path of the first loop circuit where the $I_1$ current correspondingly increases exponentially. Since the set pulse applied to terminal 34 was terminated prior to the arrival of the first pulse, the gate 31 of the cryotron $C_{15}$ is superconducting making the second current path of the first loop circuit superconducting and enabling it to receive the diverted current from the first current path.

Before all of the $I_1$ current can be diverted into the second current path of the first loop circuit, the pulse on terminal 32 is terminated at time $t_1$. When the pulse is terminated, there is no longer any current in the control 26 of the cryotron $C_{13}$ to create a magnetic field and therefore the gate 27 will again become superconducting. When this occurs, both the first and second current paths in the first loop circuit are superconducting, and the $I_1$ current will no longer be diverted exponentially into the second current path.

Since the duration of the pulses being counted is less than the time constant of the first current path of the first loop circuit, only a part of the $I_1$ current in the first current path is diverted into the second current path. This is indicated in FIGURES 5A and 5B which shows that for the duration of the first input pulse, from time $t_o$ to $t_1$, a portion of the current 43 in the first current path decreased exponentially and the current 44 in the second current path increased exponentially from zero, an equal amount. FIGURES 5A and 5B also show that after the input pulse is terminated, the current levels in the first and second current paths of the first loop circuit remain constant.

At time $t_2$ the second pulse arrives and is terminated at time $t_3$. For the duration of this pulse, i.e., from time $t_2$ to $t_3$, another increment of the $I_1$ current in the first current path is again exponentially diverted, according to the time constant of the first current path, into the second current path of the first loop circuit. It is clear then, that each input pulse arriving at terminal 32 will divert a portion or increment of the $I_1$ current from the first current path into the second current path until there is no $I_1$ current left in the first current path. However, the cryotron $C_{12}$ is designed to have its gate 25 become superconducting again before sufficient $I_1$ current is diverted into the second current path of the first loop circuit, of which the control 28 of the cryotron $C_{14}$ is a part, to cause the gate 29 of the cryotron $C_{14}$ to become normal. Also, the cryotron $C_{14}$ is designed to have its gate 29 become resistive or normal before all of the $I_1$ current is diverted into the second current path. Since the magnitude of current in the control element of a cryotron needed to cause the gate element to be in the resistive or normal state is directly proportional to the width of the control element, this requirement is easily met by properly selecting the relative dimensions of the control elements of the cryotrons $C_{12}$ and $C_{14}$.

Referring again to FIGURES 3 and 5, assume that the fourth pulse to occur has terminated at time $t_7$ as shown in FIGURE 5B and that sufficient current has already been diverted from the first current path of the first loop circuit to cause the magnetic field created by the control 24 of the cryotron $C_{12}$ to be insufficient to keep the gate 25 in the resistive state thereby causing the gate 25 to be superconducting. The second current path, of the second loop circuit of which the gate 25 of the cryotron $C_{12}$ is a part, does not receive any $I_2$ current when the gate 25 becomes superconducting because there cannot be any flux change in a closed superconducting path.

The fifth input pulse occurs at time $t_8$ and is terminated at time $t_9$. During this time more of the $I_1$ current in the first current path is diverted into the second current path of the first loop circuit until a value of current flows through the control 28 of the cryotron $C_{14}$, which is part of the second current path, that causes the gate 29 of the cryotron $C_{14}$ to become resistive. When the gate 29 of the cryotron $C_{14}$ becomes resistive, between the time $t_8$ to $t_9$, all of the $I_2$ current in the first current path, of which the gate 29 is a part, is rapidly switched into the second current path of the second loop circuit as shown in FIGURES 5C and 5D. The current can be rapidly switched into the second current path because of the small time constant of the first current path of the second loop circuit.

The $I_2$ current in the second current path of the second loop circuit passes through the lead 36 which crosses the gate 31 of the cryotron $C_{15}$ and acts as a control element for the cryotron $C_{15}$. The $I_2$ current in the superconducting lead 36 has a sufficient magnitude to cause the gate 31 of the cryotron $C_{15}$ to become resistive. When the gate 31 becomes resistive, all of the $I_1$ current that was diverted into the second current path of the first loop circuit, of which the gate 31 is a part, is rapidly switched back into the first current path of the first loop circuit before the occurrence of the next pulse which begins at time $t_{10}$ as is shown in FIGURE 5A. The rapid switching is due to the small time constant of the second current path of the first loop circuit. The $I_1$ current now flowing in the first current path of the first loop circuit passes through the control 24 of the cryotron $C_{12}$ and is of sufficient magnitude to cause the gate 25 to become resistive. When this occurs the $I_2$ current in the second current path of the second loop circuit, of which the gate 25 is a part, is rapidly switched back into the first current path of the second current loop prior to the occurrence of the next, or sixth pulse, which begins at time $t_{10}$ as is shown in FIGURES 5C and 5D. The rapid switching is due to the small time constant of the second current path of the second loop circuit.

The circuit now has reset itself to a stable state and the arrival of the next five pulses will result in the chain of events described above, i.e., the circuit will count five pulses and then begin counting again. It is to be noted, however, that the present invention is not limited to a count of five. As will be clear to those skilled in the art, the count of the circuit shown in FIGURE 3 is determined by the duration of the pulses to be counted, the time constant of the first current path of the first loop circuit, and the value of diverted current in the second current path of the first loop circuit which causes the gate 29 of the cryotron $C_{14}$ to become resistive.

Figure 6:
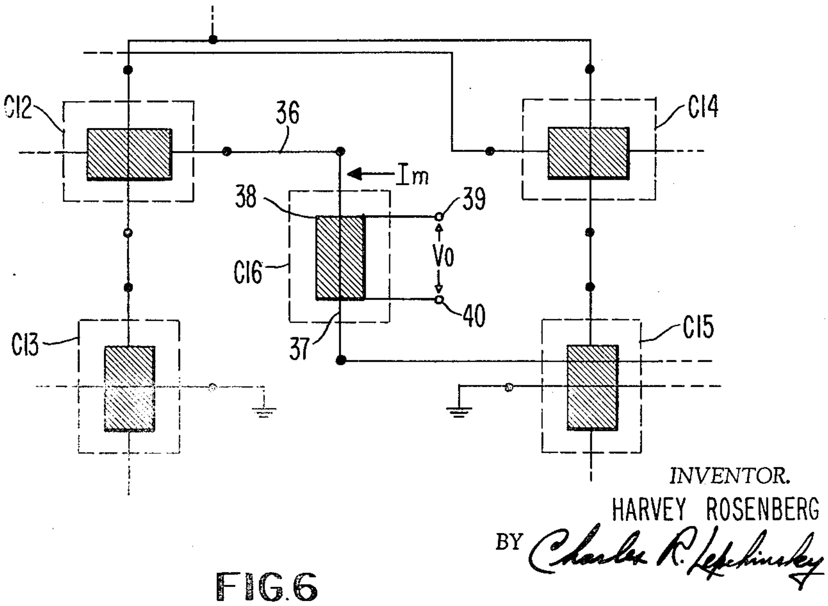
FIGURE 6 is a view illustrating a modification of the circuit shown in FIGURE 3.

Reference to FIGURES 5C and 5D shows that a pulse of $I_2$ current appears in the second current path and a pulse due to the absence of $I_2$ current appears in the first current path of the second loop circuit for every five input pulses 45 applied to the circuit. If desired, these pulses may be utilized to provide an output from the circuit to indicate that the predetermined number of pulses, comprising the count of the circuit, have occurred. For purposes of illustration an output means such as that shown in FIGURE 6 will be described, it being understood that many other means of obtaining an output can easily be derived. As seen in FIGURE 6, which shows a portion of the circuit shown in FIGURE 3, an output cryotron $C_{16}$ has its control 37 serially connected in the superconducting lead 36. The gate 38 carries a D.C. measuring current $I_m$ that is applied to the terminal 39. The operation of the output cryotron $C_{16}$ is such that, in the absence of any $I_2$ current flowing in the second current path of the second loop circuit previously mentioned, there is no current in the control 37 of the output cryotron $C_{16}$ and the gate 38 is superconducting. When the gate 38 is superconducting, there can be no voltage drop thereacross due to the measuring current $I_m$, therefore, no output voltage $V_o$ will appear between the terminals 39 and 40 which are connected to opposite ends of the gate 38. However, each time the current pulse appears in the second current path of the second loop circuit, as shown in FIGURE 5C, indicative of a count being completed, the current pulse will pass through the control 37 of the output cryotron $C_{16}$ causing the gate 38 to enter the resistive or normal state. The resistance of the gate 38 and the measuring current $I_m$ provide a voltage drop $V_o$ across the gate 38 which is seen across the terminals 39 and 40 and which may be utilized as an output signal.

What has been described is a cryotron counter comprising a first loop circuit having a first and second current path coupled to a second loop circuit also having first and second current paths. A series of pulses applied to the first current path of the first loop causes current therein to be diverted in increments into the second current path. The second loop circuit is responsive to a value of diverted current in the second path of the first loop circuit for switching the diverted current in the second path back to the first path of the first loop circuit.

What I claim is:

1. A superconducting circuit comprising:

(a) a first current source, (b) a first superconducting loop circuit providing first and second current paths coupled to said first current source, (c) a source of periodic occurring pulses coupled to said first current path of said first loop circuit for switching an increment of the current in said first path into said second path each time a pulse occurs, (d) a second current source, (e) a second superconducting loop circuit also providing first and second current paths coupled to said second current source, (f) means coupling said second loop circuit to reset said first loop circuit wherein said second loop circuit is respectively responsive to predetermined values of remaining and diverted current in said first and second paths of said first loop, which are proportional to predetermined numbers of pulses applied to said first path of said first loop circuit, for automatically switching the switched current in said second path of said first loop circuit back to the said first path of said first loop circuit prior to the arrival of a next pulse, and (g) output means associated with said second loop circuit for providing an output whenever the current in said second path of said first loop is switched back to said first path of said first loop.

2. A superconducting circuit comprising:

(a) a first current source, (b) a first superconducting loop circuit providing first and second parallel current paths coupled to said first current source, (c) a source of periodic occurring pulses, (d) cryotron means associated with said first parallel path of said first superconducting loop adapted to receive said pulses and for diverting an increment of the current in said first path into said second path each time a pulse occurs, (e) a second current source, (f) a second superconducting loop circuit including further cryotron means also providing first and second parallel current paths coupled to said second current source, (g) said second loop circuit coupled to reset said first loop circuit by being respectively responsive to predetermined values of remaining and diverted currents in said first and second paths of said first loop, which are proportional to predetermined numbers of pulses applied to said cryotron means associated with said first path of said first loop, for automatically switching the diverted current in said second path of said first loop back to said first path of said first loop prior to the occurrence of a next pulse from said pulse source, and (h) superconducting circuit means coupled to said second loop circuit for providing an output each time the diverted current in said second path of said first loop is automatically switched back to said first path of said first loop.

3. A superconducting counter circuit comprising:

(a) a first and second source of current, (b) a first superconducting loop having first and second parallel current paths coupled to said first source of current, (c) a second superconducting loop also having first and second parallel current paths coupled to said second source of current, (d) a source of regularly occurring pulses, (e) means responsive to said source of pulses for switching the current provided by said first current source from said first parallel path of said first superconducting loop, in increments, into said second parallel path of said first superconducting loop, (f) superconducting circuit means coupling said first superconducting loop to said second superconducting loop such that the current provided by said second current source will flow only in said first parallel path of said second superconducting loop until a predetermined amount of current, indicative of a predetermined number of said pulses, is switched, in increments, from said first parallel path to said second parallel path of said first superconducting loop, at which time the current in the first parallel path of said second superconducting loop is rapidly switched into said second parallel path of said second superconducting loop, and (g) said current in said second parallel path of said second superconducting loop causing said current switched in increments into said second parallel path of said first superconducting loop to be rapidly switched back to said first parallel path of said first superconducting loop which in turn causes the current in said second parallel path of said second superconducting loop to be rapidly switched back to said first parallel path of said second superconducting loop whereupon the current in said first parallel path of said first superconducting loop will again be diverted, in increments, into said second parallel paths of said first superconducting loop in response to said input pulses.

4. The combination defined in claim 3 further including output means associated with said second superconducting loop for providing an output each time the switched current in said second current path of said first superconducting loop is switched back to said first current path of said first superconducting loop.

5. The combination defined in claim 3 wherein the time constant of the first current path of said first loop circuit is greater than the time constant of the remaining three current paths.

6. A superconducting counter circuit comprising:

(a) a first and second current source, (b) first, second, third and fourth cryotrons each having at least a control element and a gate element, (c) two parallel paths of current coupled to said first current source, (d) one of said parallel paths coupled to said first current source comprising said gate element of said first cryotron serially connected to said control element of said fourth cryotron and the other said parallel path comprising said gate element of said third cryotron serially connected to said control element of said second cryotron, (e) two parallel paths of current coupled to said second current source.

(f) one of said parallel paths coupled to said second current source comprising said control element of said third cryotron serially connected to said gate element of said fourth cryotron and the other parallel path comprising said gate element of said second cryotron, and, (g) a source of pulses coupled to said control element of said first cryotron, (h) said source of pulses providing pulses having a time duration less than the time constant of said parallel path coupled to said first current source which includes said gate element of said first cryotron serially connected to said control element of said fourth cryotron.

7. The combination defined in claim 6 further including output means associated with one of said paths coupled to said second current source.

8. The combination defined in claim 6 wherein the time constant of the parallel path of current, comprising the gate element of said first cryotron serially connected to said control element of said fourth cryotron, is greater than the time constants of the three remaining current paths.

9. A superconducting circuit comprising:

(a) a first and second source of current, (b) a first superconducting loop circuit providing first and second parallel current paths coupled to said first current source, (c) a second superconducting loop circuit also providing first and second parallel current paths coupled to said second current source, (d) said first and second paths of said first and second loop circuits having a predetermined time constant relationship, (e) a source of periodic occurring pulses providing pulses having a time duration less than the time constant of said first path of said first loop, (f) cryotron means associated with said first path of said first loop circuit being adapted to receive the pulses from said pulse source for diverting an increment of the current in said first path to said second path of said first loop circuit each time a pulse occurs, and (g) superconducting circuit means including cryotron means coupling said first loop circuit to said second loop circuit such that said second loop circuit is responsive to a predetermined value of diverted current in said second path of said first loop circuit, which is indicative of a predetermined number of pulses applied to said cryotron means associated with said first path of said first loop, for rapidly switching the diverted current in said second path of said first loop back to said first path of said first loop prior to the occurrence of the next pulse from said pulse source.

10. The combination defined in claim 9 further including cryotron output means associated with said second loop circuit for providing an output each time the diverted current in said second path is rapidly switched back to said first path of said first loop circuit.

11. A superconducting counter circuit comprising:

(a) a first and a second current source, (b) a first superconducting loop circuit providing first and second parallel current paths connected to said first current source, (c) a first cryotron located in said first parallel path and connected to receive count pulses for diverting an increment of the current in said first path into said second path each time a count pulse occurs, (d) an automatic reset circuit connected to said second current source including (e) a second cryotron and a third cryotron, (f) said second cryotron being located in said first parallel path and said third cryotron being located in said second parallel path, (g) circuit means causing said second cryotron to be initially resistive and said third cryotron to be superconducting, and in response to a number of said count pulses to cause both said cryotrons to be superconducting, and in response to a further count pulse to cause said third cryotron to be resistive, thereby diverting current from said second current source through said second cryotron to reset said counter circuit, whereby the diverted current of said first loop circuit is caused to again flow in said first parallel path.

References Cited by the Examiner

UNITED STATES PATENTS

| | | | |
|---|---|---|---|
| 2,988,275 | 6/1961 | Thomason | 235—92 |
| 3,021,440 | 2/1962 | Anderson | 307—88.5 |

JOHN W. HUCKERT, *Primary Examiner.*

MALCOM A. MORRISON, *Examiner.*